(12) United States Patent
Luo et al.

(10) Patent No.: US 10,176,854 B2
(45) Date of Patent: Jan. 8, 2019

(54) MEMORY DECODING SYSTEM

(71) Applicant: Semiconductor Manufacturing International (Shanghai) Corporation, Shanghai (CN)

(72) Inventors: Guangyan Luo, Shanghai (CN); Hao Ni, Shanghai (CN); Chuntian Yu, Shanghai (CN); Xiaoyan Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/860,268

(22) Filed: Jan. 2, 2018

(65) Prior Publication Data

US 2018/0122437 A1    May 3, 2018

Related U.S. Application Data

(62) Division of application No. 15/249,580, filed on Aug. 29, 2016, now Pat. No. 9,892,769.

(30) Foreign Application Priority Data

Aug. 31, 2015   (CN) .......................... 2015 1 0546373

(51) Int. Cl.
   *G11C 8/00*      (2006.01)
   *G11C 7/12*      (2006.01)
   *G11C 11/4094*   (2006.01)
   *G11C 11/4096*   (2006.01)
   *G11C 7/14*      (2006.01)
   *G11C 8/10*      (2006.01)

(52) U.S. Cl.
   CPC ............... *G11C 7/12* (2013.01); *G11C 7/14* (2013.01); *G11C 11/4094* (2013.01); *G11C 11/4096* (2013.01); *G11C 8/10* (2013.01)

(58) Field of Classification Search
   CPC .................................................. G11C 11/4094
   USPC ...................................................... 365/230.06
   See application file for complete search history.

(56) References Cited

U.S. PATENT DOCUMENTS

| 5,838,612 | A  | * | 11/1998 | Calligaro | ............ G11C 11/5621 365/185.03 |
| 6,246,621 | B1 | * | 6/2001  | Miyamoto  | ............... G11C 7/14 365/189.09 |
| 8,050,130 | B2 |   | 11/2011 | Lee et al. | |
| 8,848,467 | B1 |   | 9/2014  | Hua et al. | |

(Continued)

*Primary Examiner* — Son Mai
(74) *Attorney, Agent, or Firm* — Anova Law Group, PLLC

(57) ABSTRACT

A memory decoding system includes a memory decoding reference current module. The memory decoding reference current module includes: a first reference current unit connected to one end of a second reference bit line; a second reference current unit connected to one end of a first reference bit line; a third reference current unit connected to one end of a third reference bit line; a first reference NMOS transistor, a source of which is connected to the second reference bit line; a second reference NMOS transistor, a source of which is connected to a drain of the first reference NMOS transistor; and a gate of the first reference NMOS transistor and a gate of the second NMOS transistor are connected to a logic high level.

10 Claims, 6 Drawing Sheets

(56) References Cited

U.S. PATENT DOCUMENTS 9,607,675 B1 3/2017 Huang et al.
2008/0175056 A1* 7/2008 Lee ................... G11C 16/24
                                                    365/185.11

* cited by examiner

MEMORY DECODING SYSTEM

CROSS-REFERENCES TO RELATED APPLICATIONS

This application is a divisional of U.S. patent application Ser. No. 15/249,580, filed on Aug. 29, 2016, which claims the priority of Chinese patent application No. 201510546373.3, filed on Aug. 31, 2015, the entirety of which is incorporated herein by reference.

FIELD OF THE INVENTION

The present invention generally relates to the field of semiconductor and, more particularly, relates to control methods and control apparatus of memory decoding systems.

BACKGROUND

Non-volatile memory is a commonly used type of semiconductor devices. There are many kinds of non-volatile memory devices according to their materials and structures. Recently, with the popularity of portable apparatus, such as cell phones and computers, etc., the non-volatile memory have been extensively developed.

In the existing techniques, during the read operation, because a coupling effect is generated among bit lines (BLs) when distances among bit lines reach a pre-set value, the voltage of the selected bit lines may be increased because of the coupling effect between the selected bit lines and the unselected bit lines, while the reference output signal keeps stable.

Under such a circumstance, the comparison results between values of the signals of the selected bit lines and values of the reference output signals may be incorrect. Such an error may lead to a read failure of the memory; and the reliability of the memory may be significantly reduced. The disclosed methods and apparatus are directed to solve one or more problems set forth above and other problems in the art.

BRIEF SUMMARY OF THE DISCLOSURE

One aspect of the present disclosure includes a control method of a memory decoding system including a decoder having at least a first PMOS transistor, a second PMOS transistor, a first NMOS transistor, a second NMOS transistor and a fourth NMOS transistor, a memory cell, and at least a first bit line and a second bit line. The control method includes applying a first control signal, being at a logic low level during a first read operation stage of a read operation and at a logic high level during a second read operation stage after the first read operation stage of the read operation, to a gate of the first PMOS transistor; applying a second control signal, being at a logic low level to during the read operation, to a gate of the second PMOS transistor; applying a logic high level to a source of the first PMOS transistor; applying a logic high level to a source of the second PMOS transistor; applying a fourth control signal, being at a logic low level during the read operation, to a gate of the first NMOS transistor; applying a fifth control signal, being at a logic high level during the read operation, to a gate of the second NMOS transistor; and applying a seventh control signal being at a logic high level during the read operation, to a gate of the fourth NMOS transistor.

Another aspect of the present disclosure includes a control apparatus of a memory decoding system. The a control apparatus of a memory decoding system comprises a memory decoding system comprising a decoder including at least a first PMOS transistor, a second PMOS transistor, a first NMOS transistor, a second NMOS transistor, a memory cell, a first bit line and a second bit line; a first control unit configured to apply a first control signal, being at a logic low level during a first read operation stage of a read operation and at a logic low level during a second read operation stage after the first read operation stage of the read operation, to a gate of the first PMOS transistor; a second control unit configured to apply a second control signal, being at a logic low level during the read operation, to a gate of the second PMOS transistor; a third control unit configured to apply a logic high level to a source of the first PMOS transistor; a fourth control unit configured to apply a logic high level to a source of the second PMOS transistor; a fifth control unit configured to apply a fourth control signal, being at the logic low level during the read operation, to a gate of the first NMOS transistor; a sixth control unit configured to apply a fifth control signal, being at the logic high level during the read operation, to a gate of the second NMOS transistor; and a seventh control unit configured to apply a seventh control signal, being at the logic high level during the read operation, to a gate of the fourth NMOS transistor.

Another aspect of the present disclosure includes a reference current module. The reference current module includes a first reference current unit connected to one end of a second reference bit line; a second reference current unit connected to one end of a first reference bit line; and a third reference current unit connected to one end of a third reference bit line.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
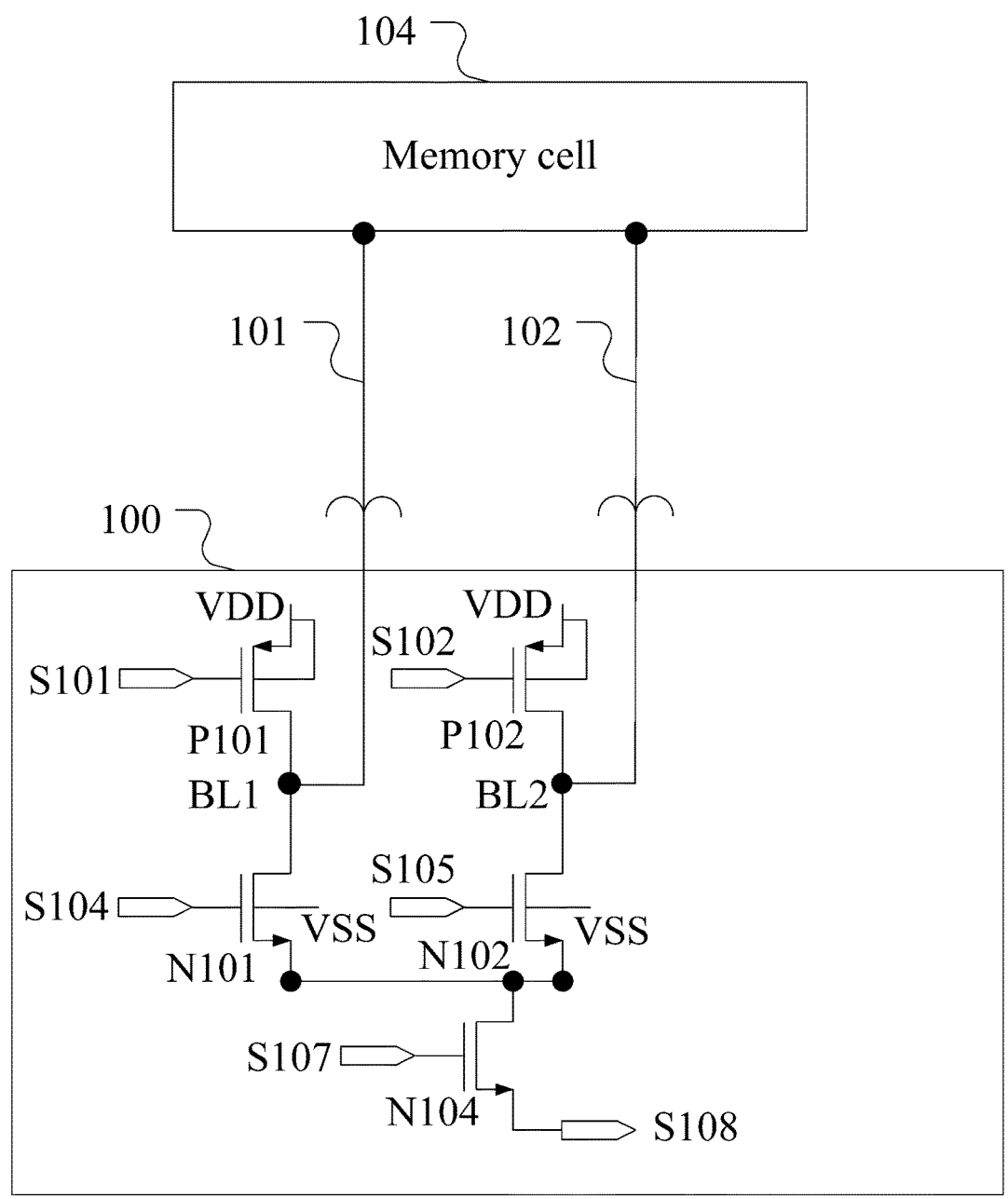
FIG. 1 illustrates an exemplary memory decoding system consistent with the disclosed embodiments.

FIG. 1 illustrates an exemplary memory decoding system consistent with the disclosed embodiments. For illustrative purposes, two bit lines are shown in FIG. 1.

As shown in FIG. 1, the memory decoding system may include a memory cell 104, a first bit line 101, a second bit line 102, a decoder 100 of the memory cell, and a pre-set preparation unit (not shown). The decoder 100 of the memory may include a first PMOS transistor P101, a second PMOS transistor P102, a first NMOS transistor N101, a second NMOS transistor N102, and a fourth NMOS transistor N104.

A first control signal S101 may be applied to the gate of the first PMOS transistor P101. A second control signal S102 may be applied to the gate of the second PMOS transistor P102. A fourth control signal S104 may be applied to the gate of the first NMOS transistor PN101. A fifth control signal S105 may be applied to the gate of the second NMOS transistor N102. A seventh control signal S107 may be applied to the gate of the fourth NMOS transistor N104. The source of the fourth NMOS transistor N104 may output the output signal 108 of the decoder 100. A logic high level VDD may be applied to the source of the first PMOS transistor P101 and the source of the second PMOS transistor P102.

A first bit line 101 may be connected to the drain of the first PMOS transistor P101. A second bit 102 may be connected to the drain of the second PMOS transistor P102.

A read operation of the memory may include a first read operation stage and a second read operation stage. The second read operation stages may be after the first read operation stage. Whether or not a read operation is performed may be determined by comparing the voltage of a selected bit line and a reference voltage during the second read operation stage.

When the memory needs to perform a read operation to the memory cell 104 corresponding to the second bit line 102, during the first read operation stage, the pre-set preparation unit may pull down the output signal 108 of the decoder 100 and a reference output voltage to be a logic low level. The first control signal 101 and the second control signal 102 may be at the logic low level. Thus, the first PMOS transistor P101, the second PMOS transistor P102 and the third PMOS transistor P103 may be turned on.

Further, the seventh control signal 107 may be at the logic high level. Thus, the fourth NMOS transistor N104 may be turned on. The fifth control signal S105 may be at the logic high level; and the fourth control signal S104 and the sixth control signal 106 may be at the logic low level. Thus, the first NMOS transistor N101 may be turned off; and the second NMOS transistor N102 may be turned on. Therefore, the output signal 108 of the decoder 100 may represent the voltage on the second bit line 102; and may not be affected by the voltage on the first bit line 101.

The pulling-down ability of the pre-set preparation unit to the second bit line 102 may be greater than the pulling-up ability of the logic high level to the second bit 102. Thus, the voltage on the second bit line 102 may be reduced to a certain extend. Further, the connection between the decoder 100 and the memory cell 104 may need be through the first bit line 101 and the second bit line 102. When the distance between the first bit line 101 and the second bit line 102 reaches a pre-set threshold value, a coupling effect may be generated. Thus, the second bit line 102 may pull down the first bit line 101 because of the coupling effect.

During the second read operation stage, the pre-set preparation unit may stop pulling down the output signal 108 of the decoder 100 and the reference signal. The first control signal S101 and the second control signal S102 may be at the logic low level. Thus, the first PMOS transistor P101 and the second PMOS transistor P102 may be turned on. The seventh control signal S107 may be at the logic high level. Thus, the fourth NMOS transistor N104 may be turned on. The fifth control signal S105 may be at the logic high level; and the fourth control signal S104 and the sixth control signal S106 may be at the logic low level. Thus, the first NMOS transistor N101 may be turned on; and the second NMOS transistor N102 may be turned on.

Thus, the voltage of the second bit line 102 may be pulled up by the logic high level VDD. Then, the second bit line 102 may pull up the output signal 108 of the decoder 100 through the second NMOS transistor N102 and the fourth NMOS transistor N104. When the second bit line 102 is being pulled up by the logic high level VDD, the voltage on the first bit line 101 may be increased because the first bit line 101 may also be pulled up by the logic high level VDD through the first PMOS transistor P101. Because of the coupling effect, the voltage on the second bit line 102 may also be increased.

Figure 2:
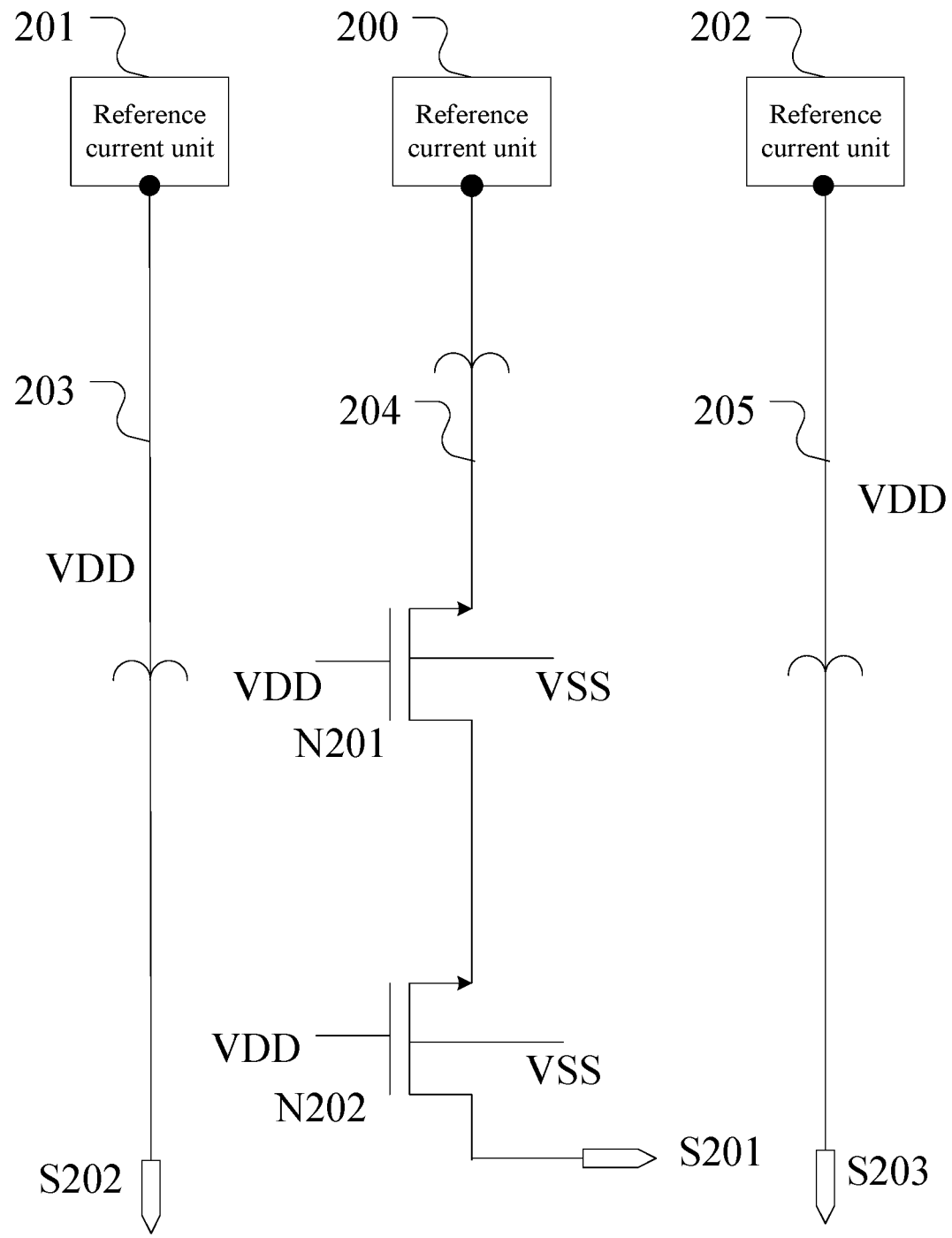
FIG. 2 illustrates an exemplary memory decoding reference current module consistent with the disclosed embodiments.

FIG. 2 illustrates an exemplary memory decoding reference current module. As shown in FIG. 2, the reference current module may include a first reference current unit 200, a second reference current unit 201 and a third reference current unit 202. The second reference current unit 201 may be connected to one end of a first reference bit line (REFBL) 203. The first reference current unit 200 may be connected to one end of a second reference bit line 204. The third reference current unit 202 may be connected to one end of a third reference bit line 205.

The first reference bit line 203 and the third reference bit line 205 may be configured as un-selected reference bit lines (unsel-BLs), e.g., a first un-selected reference bit line 203 and a second un-selected reference bit line 205, respectively. The second reference bit line 204 may be configured as a selected reference bit line (sel-BL). The second reference bit line 204 may be connected to the source of an NMOS transistor N201.

The drain of the NMOS transistor N201 may be connected to the source of an NMOS transistor N202; and the drain of the NMOS transistor N202 may output a signal S201. The gate of the NMOS transistor N201 and the gate of the NMOS transistor N202 may be connected to the logic high level. The other ends of the first un-selected reference bit line 203 and the other end of the second un-selected reference bit line 205 may output a signal S202 and a signal S203, respectively.

Because the first un-selected reference bit line 203 and the second un-selected reference bit line 205 coupling to the selected reference bit line 204 may be at a stable high level, during the second read operation stage, the reference output signal S201 may not be pulled up under the effect of the coupling between the reference output signal S202 and the out signal S203.

Under such a circumstance, during the second read operation stage, because of the couplings among the bit lines, the voltage on the second bit line 102 may be increased by the coupling from the first bit line 101. The reference output signal S201 may not be pulled up by the effect of the coupling between the no-selected reference signal S202 and the output signal S203. Such a condition may affect the comparison between the output signal S108 of the decoder and the reference output signal S201. Thus, the read operation of the memory may be at fault; and the reliability of the product may be significantly reduced. Such issues may be overcome by improved control methods and control apparatus.

The improved control methods may still be described using the memory decoding system illustrated in FIG. 1. That is, FIG. 1 illustrates an exemplary memory decoding system consistent with the disclosed embodiments. As shown in FIG. 1, the memory decoding system may include a decoder 100, a pre-set preparation unit (not shown), a memory cell 104, a first bit line 101, and a second bit line 102. When the bit lines (i.e., the first bit line 101 and the second bit line 2) reach to a certain pre-set distance, a coupling effect may be generated.

The decoder 100 may include a first PMOS transistor P101, a second PMOS transistor P102, a first NMOS transistor N101, a second NMOS transistor N102 and a fourth NMOS transistor N104. The source of the fourth transistor N104 may be the output terminal of the decoder 100 to output the output signal S108.

The first end of the first bit line 101 may be connected to the drain of the first PMOS transistor P101. The second end opposing to the first end of the first bit line 101 may be connected to the memory cell 104.

The first end of the second bit line 102 may be connected to the drain of the second PMOS transistor P102. The second end opposing to the first end of the second bit line 102 may be connected to the memory cell 104.

Figure 8:
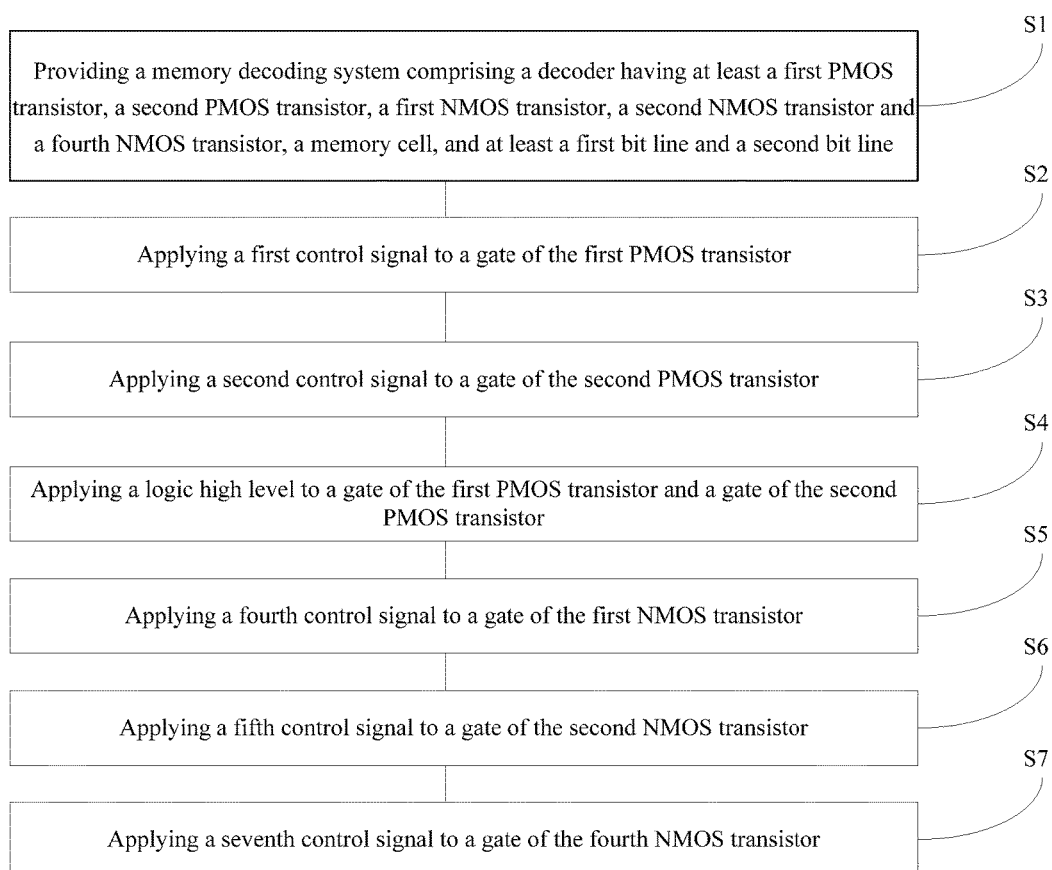
FIG. 8 illustrates an exemplary control method of a memory decoding system consistent with the disclosed embodiments.

FIG. 8 illustrates an exemplary control method of the memory decoding system consistent with the disclosed embodiments. The control method includes providing the memory decoding system illustrated in FIG. 1 (S1).

The control method may also include applying a first control signal S101 to the gate of the first PMOS transistor P101 (S2). The read operation of the memory may include a first read operation stage and a second read operation stage. The second read operation stage may be after the first read operation stage. The first control signal S101 may be at a logic low level at the first read operation stage; and may be at a logic high level at the second read operation stage.

Further, the control method may include applying a second control signal 102 to the gate of the second PMOS transistor P102 (S3). The second control signal 102 may be at a logic low level during the read operation.

Further, the control method may also include applying a logic level VDD to the source of the first PMOS transistor P101 and the source of the second PMOS transistor P102 (S4).

Further, the control method may also include applying a fourth control signal S104 to the first NMOS transistor N101 (S5). The fourth control signal S104 may be at a logic high level during the read operation.

Further, the control method may also include applying a fifth control signal S105 to the gate of the second NMOS transistor N102 (S6). The fifth control signal S105 may be at a logic high level during the read operation.

Further, the control method may also include applying a seventh control signal S107 to the gate of the fourth NMOS transistor N104 (S7). The seventh control signal S107 may be at a logic high level during the read operation.

Referring to FIG. 1, when the memory needs to perform a read operation to the memory cell 104 corresponding to the second bit line 102, during the first read operations stage, the pre-set preparation unit may pull down the output signal S108 and a reference output signal to be a logic low level. The first control signal S101 and the second control signal S102 may be at a logic low level. Thus, the first PMOS transistor P101 and the second PMOS transistor P102 may be turned on.

Further, the seventh control signal S107 may be at a logic high level. Thus, the fourth NMOS transistor N104 may be turned on. The fifth control signal S105 may be at a logic high level; and the fourth control signal S104 and the sixth control signal S106 may be at logic low level. Thus, the first NMOS transistor N101 may be turned off; and the second NMOS transistor N102 may be turned on. Accordingly, the output signal S108 of the decoder 100 may represent the voltage on the second bit line 102; and may not be affected by the voltage of the first bit line 101.

Further, because the pulling down ability of the pre-set preparation unit may be greater than the pulling up ability of the logic high level to the second bit line 102, the voltage on the second bit line 102 may be reduced to certain extend. Because the connection between the decoder 100 and the memory cell 104 may need to be through the first bit line 101 and the second bit line 102. When the distance between the first bit line 101 and the second bit line 102 reach a pre-determined value, a coupling effect may be generated. Thus, the second bit line 102 may pull down the voltage on the first bit line 101 because of the coupling effect.

During the second read operation stage, the pre-set preparation unit may stop pulling down the output signal S108 of the decoder 100 and the reference output signal. Because the first control signal S101 may be at the logic high level, the first PMOS transistor P101 may be turned off. The second control signal S102 may be at the logic low level, thus the second PMOS transistor P102 may be turned on. The seventh signal S107 may be at the logic high level, thus the fourth NMOS transistor N104 may be turned on.

The fifth control signal S105 may be at the logic high level, and the fourth control signal S104 may be at the logic low level. Thus, the first NMOS transistor N101 may be turned off, and the second NMOS transistor N102 may be turned on. The voltage of the second bit line 102 may be pulled up to the logic high level VDD. The second bit line 102 may pull up the output signal 108 of the decoder through the second NMOS transistor N102 and the fourth NMOS transistor N104.

When the voltage of the second bit line 102 is pulled up to the logic high level VDD, the voltage on the first bit line 101 may not be pulled up to increase to the logic high level VDD through the first PMOS transistor P101 because the first PMOS transistor (i.e., a pull up transistor) is disable. Thus, the voltage on the second bit line 102 may not be increased by the first bit line 101 although the first bit line 101 and the second bit line 102 may have the coupling effect. That is, the output signal S108 may not be affected by the coupling effects of bit lines; and may be kept stable.

Similarly, FIG. 2 illustrates an exemplary memory decoding reference current module consistent with the disclosed embodiments. As shown in FIG. 2, the reference current module may include a first reference current unit 200, a second reference current unit 201 and a third reference current unit 202. The second reference current unit 201 may be connected to one end of a first reference bit line (REFBL) 203. The first reference current unit 200 may be connected to one end of a second reference bit line 204. The third reference current unit 202 may be connected to one end of a third reference bit line 205.

The first reference bit line 203 and the third reference bit line 205 may be configured as un-selected reference bit lines (unsel-BLs), e.g., a first un-selected reference bit line 203 and a second un-selected reference bit line 205, respectively.

The second reference bit line 204 may be configured as a selected reference bit line (sel-BL). The second reference bit line 204 may be connected to the source of an NMOS transistor N201. The drain of the NMOS transistor N201 may be connected to the source of an NMOS transistor N202; and the drain of the NMOS transistor N202 may output a signal S201. The gate of the NMOS transistor N201 and the gate of the NMOS transistor N202 may be connected to the logic high level VDD. The other ends of the first un-selected reference bit line 203 and the other end of the second un-selected reference bit line 205 may output a signal S202 and a signal S203, respectively.

The first reference current unit 200 may be referred as a selected referred output unit. Because the first unselected bit line 203 and the second unselected bit line 205 coupling to the selected reference bit line 204 may be at a stable logic high level, during the second read operation stage, the reference output signal S201 may not be pulled up under the effect of the coupling between the reference output signal 202 and the output signal 203. That is, the reference output signal S201 may not be effected by the coupling effect of the bit lines and may be kept stable.

The memory decoding system may be controlled by any appropriate control apparatus. In one embodiment, the control apparatus illustrated in FIG. 3 may be used to control the disclosed memory decoding system illustrated in FIG. 1 and other decoding systems.

Figure 3:
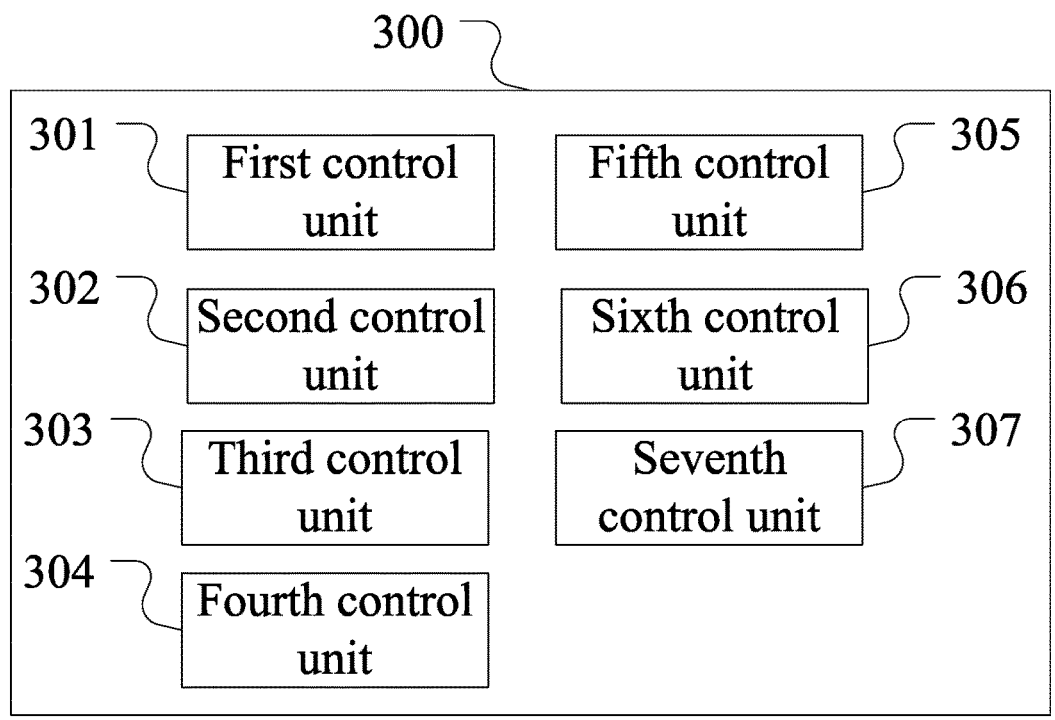
FIG. 3 illustrates an exemplary control apparatus of a memory decoding system consistent with the disclosed embodiments.

As shown in FIG. 3, the control apparatus may include a first control unit 301, a second control unit 302, a third control unit 303, a fourth control unit 304, a fifth control unit 305, a sixth control unit 306 and a seventh control unit 307.

Referring to FIG. 1 and FIG. 2, the first control unit 301 may be configured to apply a first control signal S101 to the gate of the first PMOS transistor P101. The first control signal S101 may be at a logic low level during the first read operation stage; and may be at a logic high level during the second read operation stage. As used herein, a read operation stage may include the first read operation stage and the second read operation stage. The second read operation stage may be after the first read operation stage.

The second control unit 201 may be configured to apply a second control signal S102 to the gate of the second PMOS transistor P102. The second control signal S102 may be at a logic low level during the read operation stage.

The third control unit 203 may be configured to apply the logic high level VDD to the source of the first PMOS transistor P101. The fourth control unit 204 may be configured to apply the logic high level VDD to the source of the second PMOS transistor P102.

The fifth control unit 305 may be configured to apply a fourth control signal S104 to the gate of the second NMOS transistor N102. The fourth control signal S104 may be at a logic low level during the read operation.

The sixth control unit 306 may be configured to apply a fifth control signal S105 to the gate of the second NMOS transistor N102. The fifth control signal S105 may be at a logic high level during the read operation.

The seventh control unit 307 may be configured to apply a seventh control signal S107 to the gate of the fourth NMOS transistor N104. The seventh control signal S107 may be at a logic high level during the read operation.

Figure 4:
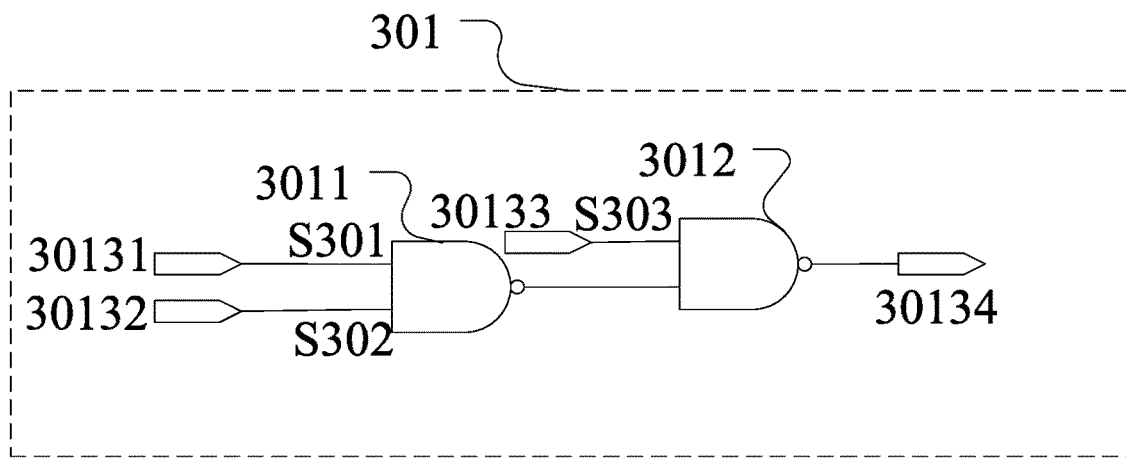
FIG. 4 illustrates an exemplary first control unit of a memory decoding system consistent with the disclosed embodiments.

FIG. 4 illustrates an exemplary first control unit consistent with the disclosed embodiments. As shown in FIG. 4, the first control unit 301 may include a first NAND (NOT AND) gate 3011, a second NAND gate 3012, and a signal input unit (not shown). The output terminal of the first NAND gate 3011 may be connected to a second terminal of the second NAND gate 3012. The output terminal 30134 of the second NAND gate 3012 may output the first control signal S101 and the third control signal S103.

The signal input unit may include a first sub control unit 30131, a second sub control unit 30131 and a third sub control unit 30133. The first sub control unit 10131 may be configured to apply a first signal S301 to the first input terminal of the first NAND gate 3011. The first signal S301 may be at the logic low level during the read operation.

The second sub control unit 30132 may be configured to apply a second signal S302 to the second input terminal to the first NAND gate 3011. The second signal S302 may be at the logic low level during the read operation.

The third sub control unit 530133 may be configured to apply a third signal S303 to the first input terminal of the second NAND gate 3012. The third signal S303 may be at the logic high level during the first read operation stage; and may be at the logic low level during the second read operation stage. Because the third signal S303 may be at the logic low level during the second read operation stage, the first control signal S101 and the third control signal S103 may be both at the logic low level during the second read operation stage.

Figure 5:
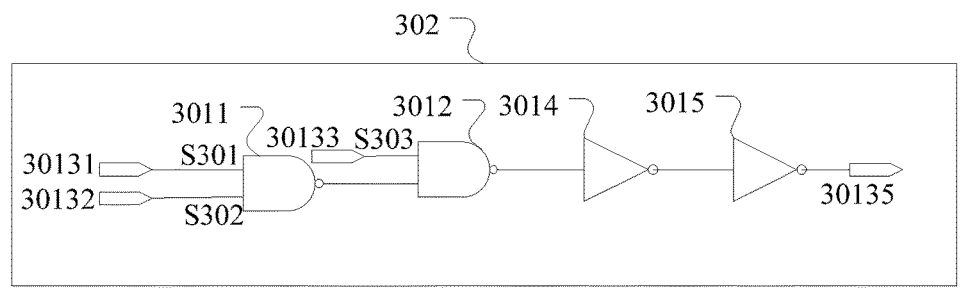
FIG. 5 illustrates another exemplary control unit of a memory decoding system consistent with the disclosed embodiments.

FIG. 5 illustrates another exemplary first control unit consistent with the disclosed embodiments. As shown in FIG. 5, the first control unit 302 may include a first NAND gate 3011, a second NAND gate 3012, a signal applying unit (not shown), a first NOR gate 3014, and a second NOR gate 3015. The output terminal of the first NAND gate 3011 may be connected to the second input terminal of the second NAND gate 3012. The input terminal of the first NOR gate 3014 may be connected to the output terminal of the second NAND gate 3012. The input terminal of the second NOR gate 3015 may be connected to the output terminal of the first NOR gate 3014. The output terminal 30135 of the second NOR gate 3015 may output the first control signal S101 and the third control gate S103.

The signal applying unit may include a first sub control unit 30131, a second sub control unit 30132 and a third sub control unit 30133. The first sub control unit 30131 may be configured to apply a first signal S301 to the first input terminal of the first NAND gate 3011. The first signal S301 may be at a logic low level during the read operation.

The second sub control unit 30132 may be configured to apply a second signal S302 to the second input terminal of the first NAND gate 3011. The second signal S302 may be at a logic low level during the read operation.

The third sub control unit 30133 may be configured to applied a third signal S303 to the first input terminal of the second NAND gate 3012. The third signal S303 may be at a logic high level during the first read operation stage; and may be at a logic low level during the second read operation stage.

For the disclosed control method of a memory decoding system, the first control signal S101 may be applied to the gate of the first PMOS transistor P101. The first control signal S101 may be at the logic low level during the first read operation stage; and may be at the logic high level during the second read operation stage. Such a signal sequence may disable the first PMOS transistor P101 during the second read operation stage. That is, the un-sel bit lines may be floated. Thus, it may prevent the output signal S108 of the decoder 100 from increasing caused by the coupling effect between the second bit line 102 and the first bit line 101 during the second read operation stage. Thus, the risk of a fault read operation of the memory may be eliminated; and the reliability of the product may be significantly improved.

Figure 6:
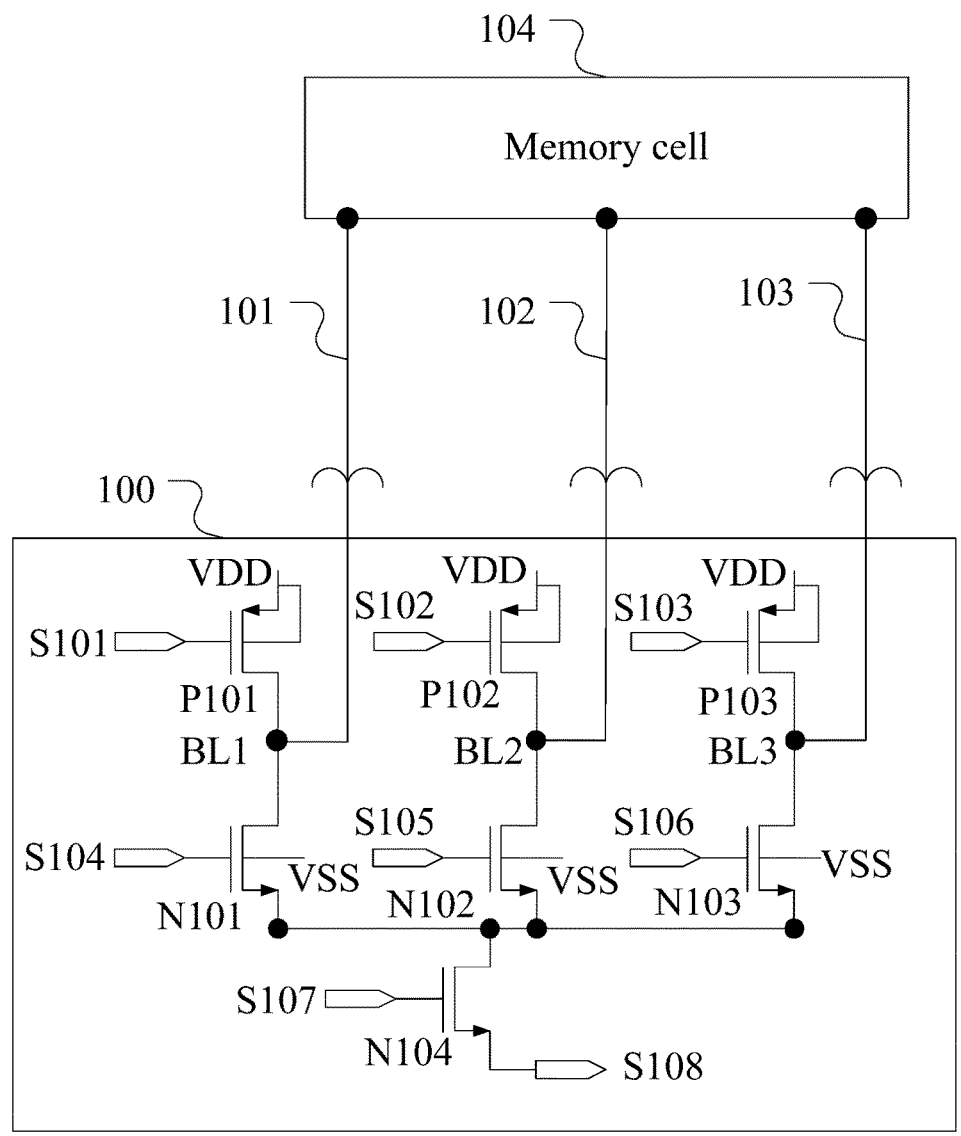
FIG. 6 illustrates another exemplary memory decoding system consistent with the disclosed embodiments.

To further explain how the disclosed memory decoding system is able to avoid the coupling effect of the bit lines to the read operation, FIG. 6 illustrates another exemplary memory decoding system consistent with the disclosed embodiments. Comparing with FIG. 1, the memory decoding system may also include a third bit line 103. The decoder 100 may also include a third PMOS transistor P103, and a third NMOS transistor N103.

The drain of the third PMOS transistor P103 may be connected to the drain of the third NMOS transistor N103. The source of the third NMOS transistor N103 may be connected to the source of the first NMOS transistor N101.

The first end of the third bit line 103 may be connected to the drain of the third PMOS transistor P103. The second end of the third bit line 103 may be connected to the memory cell 104.

The memory decoding system illustrated in FIG. 6 may be controlled by any appropriate method. In one embodiment, an exemplary method for controlling the memory decoding system illustrated FIG. 6 may include following steps.

First, a first control signal S101 may be applied to the gate of the first PMOS transistor P101. The first control signal S101 may be at a logic low level during the first read operation stage; and may be at a logic high-level during the second read operation stage. As used herein, the read operation of the memory decoding system may include a first read operation stage and a second read operation stage. The second read operation stage may be after the first read operation stage.

Further, a second control signal S102 may be applied to the gate of the second PMOS transistor P102. The second control signal S102 may be at a logic low level during the read operation.

Further, a logic high level VDD may be applied to the source of the first PMOS transistor P101; and the logic high level VDD may be applied to the source of the second PMOS transistor P102.

Further, a fourth control signal S104 may be applied to the gate of the first NMOS transistor N101. The fourth control signal S104 may be at a logic low level during the read operation.

Further, a fifth control signal S105 may be applied to the gate of the second NMOS transistor N102. The fifth control signal S105 may be at a logic high level during the read operation.

Further, a seventh control signal S107 may be applied to the gate of the fourth NMOS transistor N104. The seventh control signal S107 may be at a logic high level during the read operation.

Further, a third control signal S103 may be applied to the gate of the third PMOS transistor P103. The third control signal S103 may be at the logic low level during the first read operation stage. As used herein, the read operation may include the first read operation stage, and the second read operation stage. The second read operation stage may be after the first read operation stage.

Further, a logic high level VDD may be applied to the source of the third PMOS transistor P103.

Further, a sixth control signal S106 may be applied to the gate of the third NMOS transistor N103.

A detailed working mechanism of the driving circuit, the memory decoding system and the control method thereof may be described as followings.

A first control signal S101 may be applied to the gate of the first PMOS transistor P101; a second control signal S102 may be applied to the gate of the second PMOS transistor P102; a third control signal S103 may be applied to the gate of the third PMOS transistor P103; a fourth control signal S104 may be applied to the gate of the first NMOS transistor N101, a fifth control signal S105 may be applied to the gate of second NMOS transistor N102, a sixth control signal S106 may be applied to the gate of the third NMOS transistor N103; and a seventh control signal S107 may be applied to the fourth NMOS transistor N104. The source of the NMOS transistor N104 may output the output signal S108 of the decoder 100. The logic high level VDD is applied to the source of the first PMOS transistor P101, the source of the second PMOS transistor P102 and the source of the third PMOS transistor P103.

The bit line 101 may be connected to the drain of the first PMOS transistor P101. The second bit line 102 may be connected to the drain of the second PMOS transistor P102. The third bit line 103 may be connected to the drain of the third PMOS transistor P103.

The read operation of memory may include a first read operation stage and a second read operation stage. The second read operation stage may be after the first read operation stage. The memory may determine whether or not to perform a read operation according to a comparison between the voltage on the selected bit line and a reference voltage during the second read operation stage.

When the memory needs to perform a read operation to the memory cell 104 corresponding the second bit line 102, during the first read operation stage, the pre-set preparation unit may pull down the output signal S108 of the decoder 100 and the reference output signal to a logic low level. The first control signal S101, the second control signal S102 and the third control signal S103 may be at the logic low level, the first PMOS transistor P101, the second PMOS transistor P102 and the third PMOS transistor P103 may be turned on. The seventh control signal S107 may be at the logic high level. Thus, the fourth NMOS transistor N104 may be turned on.

The fifth control signal S105 may be at the logic high level, the fourth control signal S104 and the sixth control signal S106 may be at the logic low level. Thus, the first NMOS transistor N101 and the third NMOS transistor N103 may be turned off; and the second NMOS transistor N102 may be turned on. Therefore, the output signal S108 of the decoder 100 may represent the voltage on the second bit line 102; and may not be affected by the voltage on the first bit line 101 and the voltage on the third bit line 103.

Because the pulling up ability of the pre-set preparation unit to the second bit line 102 may be greater than the pulling up ability of the logic high level to the second bit line 102, the voltage of the second bit line 102 may be reduced to a certain extend. Further, because the connection between the decoder 100 and the memory cell 104 may need to be through the first bit line 101, the second bit line 102 and the third bit line 103, when the distances between adjacent bit lines reach to pre-set values, a coupling effect may be generated, the second bit line 102 may pull down the first bit line 101 and the third bit line 103 because of the coupling effect.

During the second read operation stage, the pre-set preparation unit may stop pulling down the output signal 108 of the decoder 100 and the reference output signal. The first control signal S101 may be at the logic high level. Thus, the first PMOS transistor P101 may be disabled. The second control signal S102 and the third control signal S103 may be at the logic high level. Thus, the second PMOS transistor P102 and the third PMOS transistor P103 may be turned off. The seventh signal S107 may be at the logic high level. Thus, the fourth NMOS transistor N104 may be turned on.

The fifth control signal S105 may be at the logic high level, and the fourth control signal S104 and the sixth control signal S106 may be at the logic low level. Thus, the first NMOS transistor N101 and the third NMOS transistor N103 may be turned off; and the second NMOS transistor N102 may be turned on.

The voltage on the second bit line 102 may be pulled up by the logic high level VDD. Then, the second bit line 102 may pull up the output signal S108 of the decoder 100 through the second NMOS transistor N102 and the fourth NMOS transistor N104. When the second bit line 102 is being pulling up by the logic high level VDD, the first bit line 101 and the third bit line 103 may also be pulled up by the logic high level VDD through the first PMOS transistor P101 and the third PMOS transistor P103 to be increased. However, because the first PMOS transistor P101 and the third PMOS transistor P103 may be disabled, the voltage on the second bit line 102 may be not be increased by the coupling effect between the bit lines; and may be kept stable.

Figure 7:
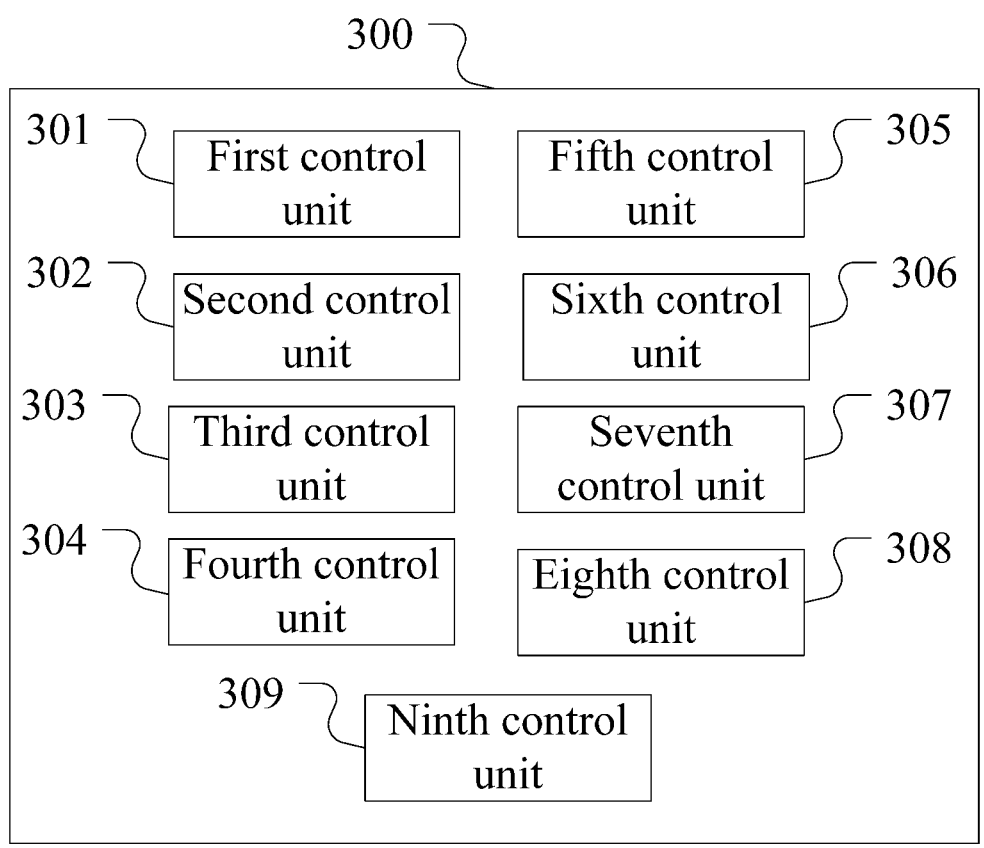
FIG. 7 illustrates another exemplary control apparatus of a memory decoding system consistent with the disclosed embodiments.

In one embodiment, an exemplary control apparatus illustrated in FIG. 7 may be used to control the disclosed memory decoding system and other systems. Comparing with the control apparatus illustrated in FIG. 3, the control apparatus 300 may also include an eighth control unit 308 and a ninth control unit 309.

The first control unit 301 may also be configured to apply a third control signal to the gate of the third PMOS transistor P103. The third control signal S103 may be at a logic low level during the first read operation stage; and may be at a logic high level during the second read operation stage.

The eighth control 308 unit may be configured to apply a logic high level to the source of the third PMOS transistor P103. The ninth control unit 308 may be configured to apply the sixth control signal S106 to the gate of the third NMOS transistor N103.

Using the disclosed method, by applying the first control signal as the logic high level to gate of the first PMOS transistor P101 during the second read operation stage, the first PMOS transistor P101 may be disabled; and the un-select bit line may be floated. Thus, it may prevent the voltage on the second bit line 102 (selected bit line) from being increased by the coupling from the first bit line 101. Further, the reference output signal S201 may also not be pulled up by the coupling from the non-selected reference output signal S202 and the output signal S203. Thus, the effect to the comparison between the output signal S108 and the reference output signal S201 may be avoided. Accordingly, the memory may be able to properly perform the read operation; and the product reliability may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory decoding system, comprising:
   a memory decoding reference current module, comprising:
   a first reference current unit connected to one end of a second reference bit line;
   a second reference current unit connected to one end of a first reference bit line; a third reference current unit connected to one end of a third reference bit line;
   a first reference NMOS transistor, a source of which is connected to the second reference bit line;
   a second reference NMOS transistor, a source of which is connected to a drain of the first reference NMOS transistor; and
   a gate of the first reference NMOS transistor and a gate of the second NMOS transistor are connected to a logic high level, wherein:
   the first reference bit line and the third reference bit line are configured as un-selected reference bit lines; and
   the second reference bit line is configured as a selected reference bit line;
   another end of the first reference bit lines and another end of the third reference bit line are configured to output signals; and
   a drain of the second reference NMOS transistor is configured to output signal.

2. The memory decoding system according to claim 1, further comprising:
   a decoder including at least a first PMOS transistor, a second PMOS transistor, a first NMOS transistor, a second NMOS transistor, a fourth NMOS transistor, a memory cell, a first bit line and a second bit line;
   a first control unit, configured to apply a first control signal being at a logic low level during a first read operation stage of a read operation and at a logic low level during a second read operation stage after the first read operation stage of the read operation to a gate of the first PMOS transistor;
   a second control unit, configured to apply a second control signal being at a logic low level during the read operation to a gate of the second PMOS transistor;
   a third control unit, configured to apply a logic high level to a source of the first PMOS transistor;
   a fourth control unit, configured to apply a logic high level to a source of the second PMOS transistor;
   a fifth control unit, configured to apply a fourth control signal, being at the logic low level during the read operation to a gate of the first NMOS transistor;
   a sixth control unit, configured to apply a fifth control signal, being at the logic high level during the read operation to a gate of the second NMOS transistor; and
   a seventh control unit, configured to apply a seventh control signal, being at the logic high level during the read operation to a gate of the fourth NMOS transistor.

3. The memory decoding system according to claim 2, wherein:
   a first end of the first bit line is connected to a drain of the first PMOS transistor;
   a second end of the first bit line is connected to the memory cell;
   a first end of the second bit line is connected to a drain of the second PMOS transistor; and
   a second end of the second bit line is connected to a storage unit.

4. The memory decoding system according to claim 2, wherein:
   a source of the fourth NMOS transistor is configured as an output terminal of the decoder.

5. The memory decoding system according to claim 2, wherein the decoder further comprises:
   a third PMOS transistor; and
   a third NMOS transistor.

6. The memory decoding system according to claim 5, wherein:
- a drain of the third PMOS transistor is connected to a drain of the third NMOS transistor; and
- a source of the third NMOS transistor is connected to a source of the first NMOS transistor.

7. The memory decoding system according to claim 6, further comprising:
- an eighth control unit, configured to apply a logic high level to a source of the third PMOS transistor; and
- a ninth control unit, configured to apply a sixth control signal to a gate of the third NMOS transistor.

8. The memory decoding system according to claim 6, wherein:
- the first control unit also applies a third control signal, being at a logic low level during the first read operation stage and at a logic high level during the second read operation stage, to a gate of the third PMOS transistor.

9. The memory decoding system according to claim 8, wherein the first control unit comprises:
- a first NAND gate;
- a second NAND gate; and
- a signal apply unit, wherein:
- an output terminal of the first NAND gate is connected to a second input terminal of the second NAND gate, and
- an output terminal of the second NAND gate outputs the first control signal and the third control signal.

10. The memory decoding system according to claim 9, wherein the signal apply unit comprises:
- a first sub control unit, configured to apply a first signal being at a logic low level during the read operation to a first input terminal of the first NAND gate;
- a second sub control unit, configured to apply a second signal being at a logic low level during the read operation to a second input terminal of the first NAND gate; and
- a third sub control unit, configured to apply a third signal being at a logic high level during the read operation to a second input terminal of the second NAND gate and at a logic low level during the read operation to a first input terminal of the second NAND gate.

* * * * *